United States Patent
Yamawaku et al.

(10) Patent No.: US 8,398,745 B2
(45) Date of Patent: Mar. 19, 2013

(54) SUBSTRATE PROCESSING APPARATUS AND EXHAUST METHOD THEREFOR

(75) Inventors: Jun Yamawaku, Nirasaki (JP); Junji Oikawa, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 469 days.

(21) Appl. No.: 12/726,612

(22) Filed: Mar. 18, 2010

(65) Prior Publication Data

US 2010/0236406 A1 Sep. 23, 2010

Related U.S. Application Data

(60) Provisional application No. 61/228,673, filed on Jul. 27, 2009.

(30) Foreign Application Priority Data

Mar. 19, 2009 (JP) ................................ 2009-068285

(51) Int. Cl.
   *B03C 3/019* (2006.01)
   *B03C 3/36* (2006.01)
(52) U.S. Cl. ............. 95/64; 95/70; 95/71; 95/78; 96/52; 96/55; 96/63
(58) Field of Classification Search ................ 95/64, 70, 95/71, 78; 96/52, 53, 55, 63, 74; 55/385.1, 55/385.6; 118/56, 610, 621, 639, 715, 723 R, 118/728, 729; 427/255.28, 255.5
See application file for complete search history.

(56) References Cited

U.S. PATENT DOCUMENTS

| | | | | |
|---|---|---|---|---|
| 4,872,887 A * | 10/1989 | Altman et al. | | 95/60 |
| 5,922,105 A * | 7/1999 | Fujii et al. | | 95/63 |
| 6,770,117 B2 * | 8/2004 | Olander | | 95/67 |
| 6,793,717 B2 * | 9/2004 | Wu et al. | | 96/50 |
| 7,361,207 B1 * | 4/2008 | Coffey et al. | | 95/78 |
| 7,368,003 B2 * | 5/2008 | Crapser et al. | | 96/52 |
| 7,393,385 B1 * | 7/2008 | Coffey et al. | | 95/59 |
| 7,651,552 B2 * | 1/2010 | Singh et al. | | 96/55 |
| 8,152,907 B2 * | 4/2012 | Moriya | | 95/283 |
| 2003/0056648 A1* | 3/2003 | Fornai et al. | | 95/65 |
| 2007/0193448 A1* | 8/2007 | Tanaka et al. | | 96/18 |
| 2008/0092736 A1* | 4/2008 | Krigmont et al. | | 95/78 |
| 2009/0301298 A1* | 12/2009 | Seeley | | 95/58 |

FOREIGN PATENT DOCUMENTS

| JP | 1-317558 A | * 12/1989 | ........................ 95/71 |
|---|---|---|---|
| JP | 2002-353086 | 12/2002 | |

* cited by examiner

*Primary Examiner* — Richard L Chiesa
(74) *Attorney, Agent, or Firm* — Rothwell, Figg, Ernst & Manbeck, P.C.

(57) ABSTRACT

A substrate processing apparatus includes a processing chamber for accommodating therein a processing target substrate; a gas exhaust path through which a gas inside the processing chamber is exhausted; one or more exhaust pumps provided in the gas exhaust path; and a scrubber for collecting harmful components from an exhaust gas. The apparatus further includes an ionized gas supply unit for supplying to the gas exhaust path an ionized gas for neutralizing charged particles included in the exhaust gas flowing therethrough.

12 Claims, 5 Drawing Sheets

SUBSTRATE PROCESSING APPARATUS AND EXHAUST METHOD THEREFOR

CROSS-REFERENCE TO RELATED APPLICATIONS

This application claims priority to Japanese Patent Application No. 2009-068285 filed on Mar. 19, 2009, the entire contents of which are incorporated herein by reference.

FIELD OF THE INVENTION

The present invention relates to a substrate processing apparatus and an exhaust method therefor; and, more particularly, to a method for exhausting a gas inside a processing chamber of a substrate processing apparatus.

BACKGROUND OF THE INVENTION

Recently, the scaling-down of a semiconductor device has been in progress. To that end, it is needed to form a finer circuit pattern on a surface of a substrate for a semiconductor device. As the circuit pattern is formed more finely on the surface of the substrate, it becomes necessary to manage and control as foreign substances particles having small diameters of several tens of nanometers (e.g., 30 nm to 80 nm), which have conventionally been treated as being nonproblematic, because such small-sized particles tend to cause an open circuit or damage on device characteristics in a semiconductor device, for example.

As the diameters of the particles as foreign substances get smaller, an adsorption strength by which such small-sized particles are adsorbed onto a member, e.g., a substrate, may be dominantly affected by an electrostatic force. Accordingly, it becomes important to prevent the charged particles from being attached on a member, e.g., a processing target substrate, in a substrate processing apparatus employing an electrostatic chuck which attracts and holds the processing target substrate to perform the plasma-etching on the processing target substrate.

FIG. 7 is a graph showing relationships between a size (diameter) of a particle and an adsorption strength thereof. In FIG. 7, the vertical axis indicates an adsorption strength (deposition velocity) (cm/s), and the horizontal axis indicates the diameter of the particle. It can be seen that, as the diameter of the particle gets smaller, the adsorption strength is dominantly affected by the electrostatic force as described above. Accordingly, to prevent the particles from being attached on the processing target substrate or the like, it is essential to maintain the particles not to be charged or such static electricity not to be accumulated in the substrate processing apparatus.

As described above, the static electricity may cause the particles to be adsorbed onto the processing target substrate or the like and, furthermore, may cause electronic components to be damaged. For example, a semiconductor device may be damaged by the static electricity of about 1000 V. Moreover, when charges in a charged processing target substrate are released to other parts, in a substrate processing apparatus employing an electrostatic chuck for attracting the processing target substrate thereon, the processing target substrate may be damaged or a discharge trace may remain in the processing target substrate. As a result, the production yield may be lowered.

FIG. 8 shows how a substrate processing apparatus is affected by static electricity. As shown in FIG. 8, the substrate processing apparatus includes a process module 81 for performing a predetermined process on a processing target substrate (hereinafter, simply referred to as "wafer"); a loader module 82 serving as a transfer chamber that transfers the wafer; a front-opening unified pod (FOUP) 83 mounted to the loader module 82 and accommodating the wafers; and a load-lock module 84 connecting the loader module 82 to the process module 81. A processing vessel (hereinafter, referred to as "chamber") of the process module 81 is provided with a gas exhaust path 85 and a dry pump 86 which serves to exhaust a gas from the vessel.

In such a substrate processing apparatus, the following problems may be caused by static electricity accumulated therein. That is, by the static electricity accumulated in the FOUP 83, floating particles therein are charged, thereby being adsorbed onto a wafer W. Furthermore, by the static electricity, a discharge may be generated between the FOUP 83 and a wafer accommodated in the FOUP 83, thereby causing a discharge trace to remain on the wafer W. In addition, static electricity accumulated in the loader module 82 may cause particle contamination, e.g., the adsorption of the particles onto the wafer.

The inside of the load-lock module 84 is repeatedly pressurized to an atmospheric pressure state and depressurized to a vacuum state. For that reason, static electricity may be easily accumulated in the load-lock module 84. The accumulated static electricity may cause the particles to be adsorbed onto the wafer or the like. Moreover, when a wafer W is exposed to a plasma or the wafer W is attached on or detached from the electrostatic chuck in the process module 81, the wafer W may be charged, thereby causing particles to be adsorbed thereonto.

Further, while the gas inside the chamber of the process module 81 is exhausted through the gas exhaust path 85, reaction products produced by a chemical etching reaction or the like of a processing gas and unreacted residual substances may be charged by static electricity generated by friction with an inner wall surface of the gas exhaust path 85. As a result, the reaction products and the unreacted residual substances may be attached and deposited on the inner wall surface of the gas exhaust path 85. As such deposits are gradually increased, the gas exhaust path 85 may be eventually blocked.

There is a technique to prevent in advance the occurrence of the problems caused by static electricity generated in various components of such a substrate processing apparatus (see, e.g., Japanese Patent Application Publication No. 2002-353086).

In the Japanese patent Application Publication, a charge-neutralizing device is provided in an air lock chamber serving as a passage through which a processing target substrate, e.g., a wafer, is transferred between a processing chamber and the outside. The charge-neutralizing device generates an ion flow inside the air lock chamber to charge-neutralize ionic particles (remove static electricity). Then, a gas inside the air lock chamber is vacuum-evacuated, thereby exhausting and removing the particles from the air lock chamber.

Moreover, according to the Japanese patent application, after the particles attached onto the inner wall of the air lock chamber are exhausted and removed from the air lock chamber, the wafer is loaded into the air lock chamber. Then, the charged particles attached onto the wafer can be electrostatically adsorbed onto an electrode provided above the wafer by applying to the electrode a voltage, which is determined by considering the charged state of the wafer.

However, in the above-described conventional technique, there is no mention of preventing the blocking of a gas exhaust path, caused by charged particles in an exhaust gas exhausted through the gas exhaust path from a chamber which performs a predetermined process on a processing target substrate.

In addition, in the conventional technique, no detailed ion generation method is defined for the charge-neutralizing device arranged in the air lock chamber, though a method using a corona discharge is suggested to generate positive and negative ions with good balance. However, if such an ion-generating method using the corona discharge is employed, particles may be generated by the discharge, thereby causing the generated particles to be attached onto the wafer and, thus, becoming a new contamination source.

SUMMARY OF THE INVENTION

In view of the above, the present invention provides a substrate processing apparatus and an exhaust method therefor, capable of preventing a gas exhaust path from being blocked by charged particles included in an exhaust gas exhausted through the gas exhaust path from a chamber of the substrate processing apparatus.

In accordance with an aspect of the present invention, there is provided a substrate processing apparatus including a processing chamber for accommodating therein a processing target substrate; a gas exhaust path through which a gas inside the processing chamber is exhausted; one or more exhaust pumps provided in the gas exhaust path; a scrubber for collecting harmful components from an exhaust gas; and an ionized gas supply unit for supplying to the gas exhaust path an ionized gas for neutralizing charged particles included in the exhaust gas flowing therethrough.

In accordance with another aspect of the present invention, there is provided a substrate processing apparatus including a processing chamber for accommodating therein a processing target substrate; a gas exhaust path through which a gas inside the processing chamber is exhausted; one or more exhaust pumps provided in the gas exhaust path; a scrubber for collecting harmful components from an exhaust gas; and a gas ionizing unit, provided in the gas exhaust path, for ionizing the exhaust gas flowing therethrough to charge-neutralize charged particles included in the exhaust gas.

In accordance with still another aspect of the present invention, there is provided a method for exhausting a gas inside a processing chamber in a substrate processing apparatus including the processing chamber for accommodating therein a processing target substrate; a gas exhaust path through which a gas inside the processing chamber is exhausted; one or more exhaust pumps provided in the gas exhaust path; and a scrubber for collecting harmful components from an exhaust gas. The method includes supplying an ionized gas to the exhaust gas flowing through the gas exhaust path to charge-neutralize charged particles included in the exhaust gas.

In accordance with further aspect of the present invention, there is provided a method for exhausting a gas inside a processing chamber in a substrate processing apparatus including the processing chamber for accommodating therein a processing target substrate; a gas exhaust path through which a gas inside the processing chamber is exhausted; one or more exhaust pumps provided in the gas exhaust path; and a scrubber for collecting harmful components from an exhaust gas. The method includes ionizing the exhaust gas flowing through the gas exhaust path to charge-neutralize charged particles in the exhaust gas.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Embodiments of the present invention will now be described with reference to the accompanying drawings which form a part hereof.

Figure 1:
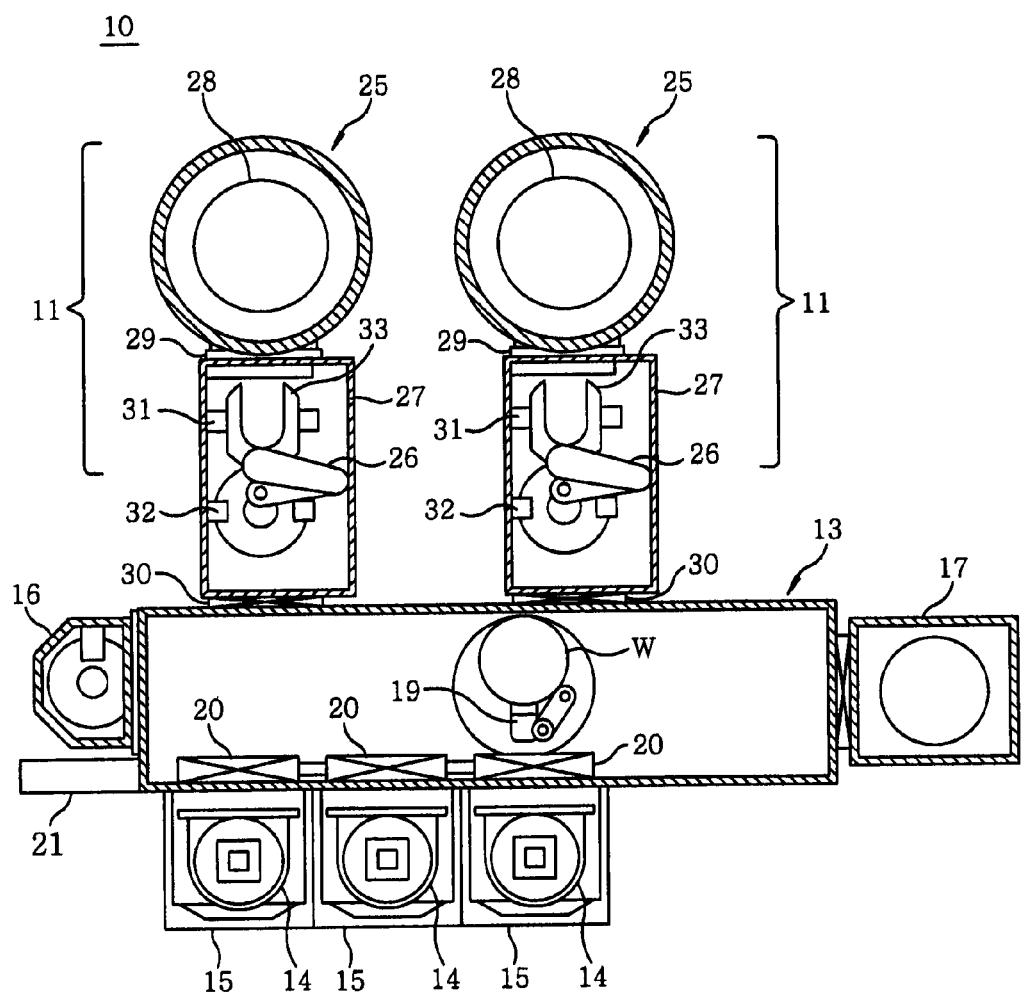
FIG. 1 is a schematic plan view showing a structure of a substrate processing apparatus in which an exhaust method is employed in accordance with embodiments of the present invention.

FIG. 1 is a schematic plan view showing a structure of a substrate processing apparatus 10 in which an exhaust method is employed in accordance with embodiments of the present invention.

As shown in FIG. 1, the substrate processing apparatus includes two process ships 11 for each performing a reactive ion etching (RIE) process on a wafer W serving as a processing target substrate; and an atmospheric transfer chamber (hereinafter, referred to as "loader module") 13 serving as a rectangular-shaped common transfer chamber connected to the two process ships 11.

Also connected to the loader module 13 in addition to the aforementioned process ships 11 are three FOUP platforms each for mounting therein a FOUP 14 serving as an accommodating vessel that accommodates, e.g., 25 sheets of wafers W; an orienter 16 for performing a prealignment of a position of the wafer W unloaded from the FOUP 14; and an after-treatment chamber 17 for performing an after-treatment on the wafer W that has been subjected to the RIE process.

The two process ships 11 are connected to a longer side of the rectangular-shaped loader module 13 and provided to opposite to the three FOUP platforms with the loader module 13 therebetween. The orienter 16 is connected to one shorter side of the loader module 13, and the after-treatment chamber 17 is connected to the other shorter side thereof.

The loader module 13 includes therein a dual SCARA (Selective Compliance Assembly Robot Arm) type transfer arm unit 19 serving as a substrate transfer unit for transferring a wafer W and has three load ports 20 serving as FOUP connecting ports for transferring wafers W therethrough, the load ports 20 being arranged at sidewalls thereof to correspond to the FOUP platforms 15, respectively. An opening/closing door is provided to each of the load ports 20. The transfer arm unit 19 is used to load and unload wafers W through the load ports 20 into and from the FOUPs 14 mounted on the FOUP platforms 15 and transfer the wafers W among the process ships 11, the orienter 16, and the after treatment chamber 17.

Each cylindrical process ship 11 includes a process module 25 having a cylindrical processing vessel (chamber) in which the wafer W is subjected to the RIE process and a load-lock module 27 having therein a link type single pick transfer arm 26 for transferring a wafer W to and from the process module 25.

The process module 25 further includes an upper and a lower electrode arranged in the chamber. The distance between the upper and the lower electrode is adequately set to perform the RIE process on the wafer W. An electrostatic chuck 28 is provided at a top portion of the lower electrode to attract and hold a wafer W by a Coulomb force.

In the process module 25, a processing gas, e.g., hydrogen bromide gas or chlorine gas, is introduced into the chamber, and the introduced processing gas is converted into a plasma by generating an electric field between the upper and the lower electrode, to thereby generate ions and radicals. Then, the RIE process is performed on the wafer W by using the thus generated ions and radicals to etch, e.g., a polysilicon layer on the wafer W.

The pressure inside the loader module 13 is maintained to the atmospheric pressure, while the inside of each process module 25 is kept in vacuum. For that reason, each load-lock module 27 includes a vacuum gate valve 29 provided at a portion connected to the process module 25 and an atmospheric gate valve 30 provided at a portion connected to the loader module 13 and, thus, the load-lock module 27 serves as a vacuum antechamber capable of adjusting the pressure therein.

The transfer arm 26 is provided at a substantially central portion of each load-lock module 27. Further, inside the load-lock module 27, a first buffer 31 is provided between the process module 25 and the transfer arm 26; and a second buffer 32 is provided between the loader module 13 and the transfer arm 26. The first and the second buffer 31 and 32 are arranged above a path of a support portion (pick) 33 supporting the wafer W, the support portion 33 being provided at a leading end portion of the transfer arm 26. The first and the second buffer 31 and 32 serves to temporarily escape the wafer W having been subjected to the RIE process above the path of the support portion 33 to make the changeover smoothly between the wafer W to be subjected to the RIE process and the wafer W having been subjected thereto in the process module 25.

The substrate processing apparatus 10 further includes a system controller (not shown) for controlling the process ships 11, the loader module 13, the orienter 16, and the after-treatment chamber 17 (hereinafter, referred to as "various components); and an operation controller 21 arranged, e.g., at one end of a shorter side of the loader module 13.

The system controller controls operations of various components based on recipes serving as programs controlling the RIE process and the transfer of the wafer W. The operation controller 21 includes a state display unit having, e.g., a liquid crystal display (LCD) for displaying operation states of various components.

Figure 2:
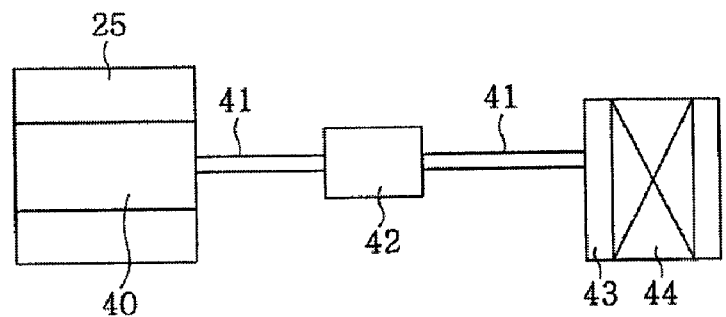
FIG. 2 is a schematic view showing a prior art structure of a gas exhaust path connected to a processing chamber (chamber) of a process module shown in FIG. 1.

FIG. 2 is a schematic view showing a structure of a gas exhaust path 41 connected to the processing vessel (chamber) 40 of the process module 25 shown in FIG. 1.

As shown in FIG. 2, a dry pump 42 serving as an exhaust pump and a scrubber 43 for collecting and removing harmful components from an exhaust gas are provided in the gas exhaust path 41 of the chamber 40 provided inside the process module 25.

In the chamber 40, a gas that is harmful to humans or environments may be employed as the processing gas, and a harmful product may be produced in a chemical etching reaction. For that reason, the scrubber 43 is provided in the gas exhaust path 41 through which the gas inside the chamber 40 is exhausted.

Inside the scrubber 43, there is provided an activated carbon adsorption layer 44 is provided, for example, and harmful substances included in the exhaust gas are adsorbed by the activated carbon adsorption layer 44. The exhaust gas which becomes harmless by adsorbing and removing the harmful substances therefrom is released to the atmosphere, for example.

In the meantime, the inside of the chamber 40 is maintained to a depressurized state that is kept in vacuum substantially, while the pressure at downstream of the dry pump 42 is substantially the atmospheric pressure. Accordingly, a temperature of the exhaust gas is lowered; and the concentration of reaction products, reaction residual substances and the like produced in the chamber 40 is increased. Therefore, the products and substances are aggregated in the exhaust gas, thereby being converted to particulate matters (particles).

Thus-generated particles are charged by static electricity generated by their friction with the exhaust gas flowing through the gas exhaust path 41. As a result, by the electrostatic force, the charged particles are combined with other particles and then accumulated on the inner wall surface of the gas exhaust path 41.

The particles exhausted from the chamber 40 are charge-neutralized by being brought into contact with the inner wall surface of the grounded gas exhaust path 41. However, when a molecular force is more dominant than the electrostatic force in combining with other particles, the generated particles are attached and deposited on the inner wall surface of the gas exhaust path 41 by the gravity for example, before being transferred to the downstream side by a flow of the exhaust gas. The surface of such deposits is charged by the friction with the exhaust gas, and the depositions are accumulated since gaseous components in the exhaust gas are attracted thereto.

Figure 3A:
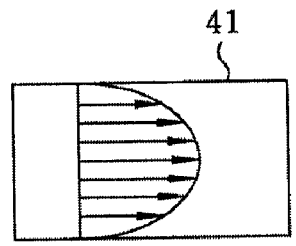
FIGS. 3A and 3B show how static electricity is generated and how a particle is adsorbed, in a gas exhaust path.
Figure 3B:
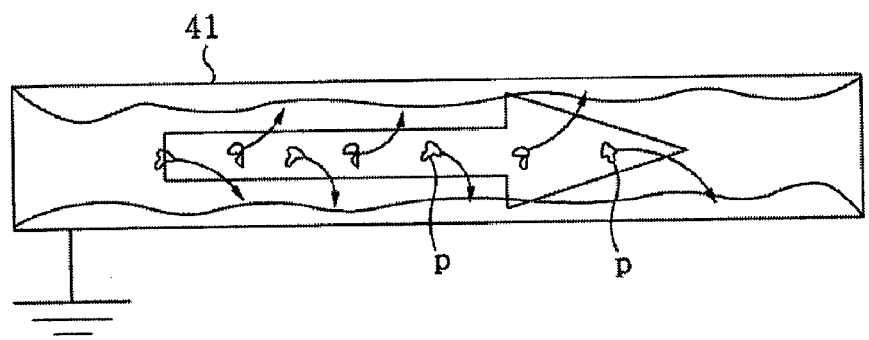

FIGS. 3A and 3B show how static electricity is generated and how a particle is adsorbed in the gas exhaust path 41. As shown in FIG. 3A, the friction at a portion becomes stronger as the portion gets closer to the inner wall surface of the gas exhaust path 41, which makes the generation of the static electricity by the friction easier. Moreover, a speed of a gas flow is high at a central portion of the gas exhaust path 41, and it becomes lower at a portion closer to the inner wall surface. Accordingly, the particles easily remain in the gas exhaust path 41.

Moreover, although the gas exhaust path 41 is grounded as shown in FIG. 3B, particles P adsorbed onto the inner wall surface of the gas exhaust path 41 become charged by the friction with the exhaust gas and, thus, other particles P are continuously adsorbed and deposited on the inner wall surface, thereby accumulating the depositions. Eventually, the gas exhaust path 41 may be blocked.

The present inventors have developed the present invention by recognizing the following facts through various experiments performed to prevent a gas exhaust path from being blocked by the deposition of the particles included in a gas inside a chamber that is exhausted through the gas exhaust path in a substrate processing apparatus. The charged particles can be charge-neutralized by charge-neutralizing the inside of the gas exhaust path, i.e., by introducing an ionized gas thereinto or ionizing an exhaust gas flowing therethrough, thereby suppressing the particles from being adsorbed onto an inner wall surface of the exhaust path. As a result, the gas exhaust path can be prevented from being blocked.

Hereinafter, the substrate processing apparatus in accordance with the first embodiment of the present invention will be described.

Figure 4A:
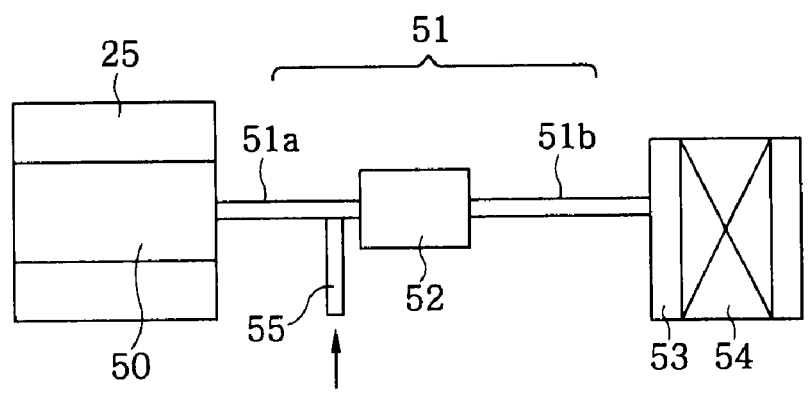
FIGS. 4A and 4B show main elements of substrate processing apparatuses in accordance with the first embodiment and a modification of the first embodiment, respectively, of the present invention.
Figure 4B:
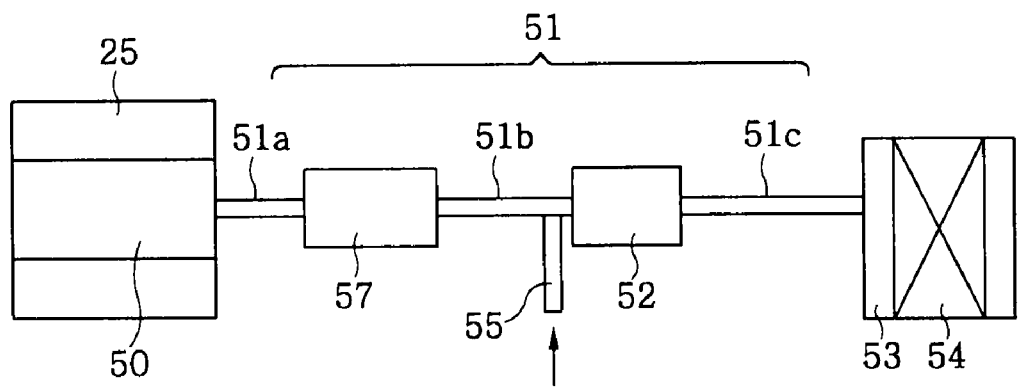

FIGS. 4A and 4B show main elements of substrate processing apparatuses in accordance with the first embodiment and a modification of the first embodiment, respectively, of the present invention.

As shown in FIG. 4A, the substrate processing apparatus mainly includes a chamber 50, provided inside the process module 25, for performing therein a predetermined etching process on a wafer W serving as a processing target substrate; a gas exhaust path 51 (including gas exhaust paths 51a and 51b) of the chamber 50; a dry pump 52 and a scrubber 53 successively provided in the exhaust path 51 in a gas flow direction; and an ionized gas supply pipe (or line) 55 serving as an ionized gas supply unit connected to the gas exhaust path 51a arranged at upstream of the dry pump 52. An activated carbon adsorption layer 54 is provided in the scrubber 53.

In the above-described substrate processing apparatus, when a gas inside the chamber 50 is exhausted, the gas inside the chamber 50 is absorbed by the dry pump 52 and flows through the gas exhaust paths 51a and 51b to be exhausted. At this time, an ionized gas is introduced through the ionized gas supply pipe 55 connected to the gas exhaust path 51a arranged at upstream of the dry pump 52 (ionized gas supply process). The ionized gas is a gas containing positive ions and the same number of negative ions as the positive ions. For example, by using a soft X-ray ionizer, a soft X-ray is irradiated to an inert gas, e.g., nitrogen gas, to release electrons from nitrogen atoms, thereby creating the positive ions and the same number of negative ions.

The ionized gas introduced through the ionized gas supply pipe 55 is combined with charged particles in the exhaust gas flowing through the gas exhaust path 51b to charge-neutralize the charged particles. Specifically, positively charged particles are neutralized by being combined with negative ions in the ionized gas, and negatively charged particles are neutralized by being combined with positive ions in the ionized gas.

The particles that have lost charges by being neutralized are transferred to the scrubber 53 by the flow of the exhaust gas without being adsorbed onto an inner wall surface of the gas exhaust path 51b. The transferred particles are collected and separated by a filter (not shown) or the like in the scrubber 53. Accordingly, the particles are suppressed from being adsorbed onto the inner wall surface of the gas exhaust path 51b.

Then, harmful substances of the exhaust gas from which the particles are separated and collected by the activated carbon adsorption layer 54 and, then, the exhaust gas is released to the atmosphere. Alternatively, the particles may be separated from the exhaust gas after the exhaust gas having such charge-neutralized particles is exhausted to an outside.

Figure 5:
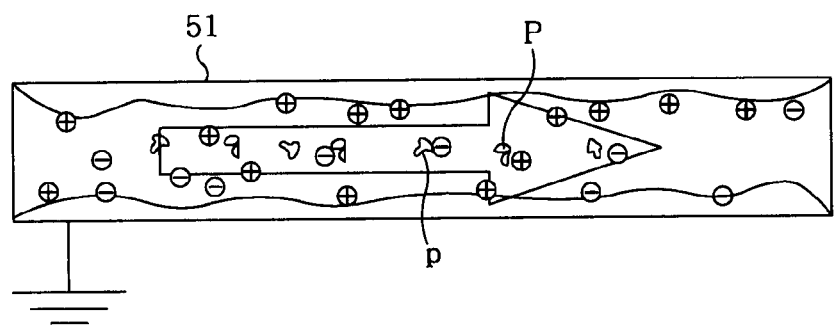
FIG. 5 shows how an ionized gas introduced into a gas exhaust path and particles in an exhaust gas are moved.

FIG. 5 shows how the ionized gas introduced into the gas exhaust path 51a and particles P in the exhaust gas are moving. As shown in FIG. 5, by introducing the ionized gas into the exhaust gas, positively charged particles P by friction are neutralized by being combined with negative ions in the ionized gas, and negatively charged particles P are neutralized by being combined with positive ions in the ionized gas. Accordingly, the particles are suppressed from being attached onto the inner wall surface of the gas exhaust path 51.

In accordance with the first embodiment, the ionized gas supply pipe 55 is connected to the gas exhaust path 51, through which the gas inside the chamber 50 is exhausted, at upstream of the dry pump 52. Accordingly, the charged particles in the exhaust gas flowing through the gas exhaust path 51b can be charge-neutralized by using the ionized gas. Therefore, the particles can be suppressed from being adsorbed onto the inner wall surface of the gas exhaust path 51b, thereby preventing the gas exhaust path 51b from being blocked.

Conventionally, heaters for preventing the temperature of the exhaust gas from being decreased are provided substantially over an entire area of the gas exhaust path 51 to prevent the gas exhaust path 51 from being blocked. However, in accordance with the first embodiment, it is possible to significantly reduce the number of the heaters or completely eliminate the heater.

It is preferable to provide the ionized gas supply pipe 55 at immediate upstream of the dry pump 52 in the first embodiment. The reason is described as follows.

In the gas exhaust path 51, upstream (gas exhaust path 51a side) of the dry pump 52 is in a vacuum (depressurized) state; on the other hand, downstream (gas exhaust path 51b side) of the dry pump 52 is in an atmospheric pressure state. The particles may easily be produced in the exhaust gas of the atmospheric pressure state and, thus, a particle concentration is thought to be high in the gas exhaust path 51b. Moreover, a distance in which such charge-neutralization is performed by the ionized gas is smaller than, e.g., about 1000 mm. It is preferable to introduce the ionized gas at immediate upstream of the gas exhaust path 51b in order to efficiently charge-neutralize the particles in the exhaust gas.

In the present embodiment, the ionized gas supply pipe 55 is provided at upstream of the dry pump 52; however, a joint portion with the ionized gas supply pipe 55 is not limited to the upstream side thereof. Alternatively, the ionized gas supply pipe 55 may be provided at a downstream side of the dry pump 52. In this case, it is preferable to provide the ionized gas supply pipe 55 at immediate downstream thereof. In such a case, a sufficiently long enough distance in which the supplied ionized gas and the exhaust gas flowing through the gas exhaust path 51b are mixed is secured before reaching to the scrubber 53 and, thus, the charge-neutralization of the charged particles may be improved, thereby increasing an efficiency of preventing the gas exhaust path 51b from being blocked by such particle adsorption.

An inert gas, e.g., nitrogen gas, is introduced into the dry pump 52 disposed on the gas exhaust path 51 provided with the scrubber 53 to dilute harmful substances. Therefore, the inert gas for diluting harmful substances may be ionized first, and the ionized may be directly introduced into the dry pump 52. In this case, it is not necessary to provide an additional gas supply system.

When the ionized gas supply pipe 55 is provided at downstream of the dry pump 52 or when the ionized inert gas for diluting harmful substances is directly introduced into the dry pump 52, the charged particles in the exhaust gas can be charge-neutralized and, thus, it is possible to suppress the particles from being attached onto the inner wall surface of the gas exhaust path 51b, thereby preventing the blocking of the gas exhaust path 51b, as in the first embodiment.

A substrate processing apparatus in accordance with the modification of the first embodiment shown in FIG. 4B is different from the apparatus shown in FIG. 4A, in that a turbo pump 57 and the dry pump 52 serving as exhaust pumps are sequentially provided in a gas flowing direction of the gas exhaust path 51, and the ionized gas supply pipe 55 is provided at immediate upstream of the dry pump 52. In such a substrate processing apparatus, a gas exhaust path 51c can also be prevented from being blocked by suppressing the particles from being adsorbed onto the inner wall surface of the gas exhaust path 51c, as in the first embodiment.

Figure 6A:
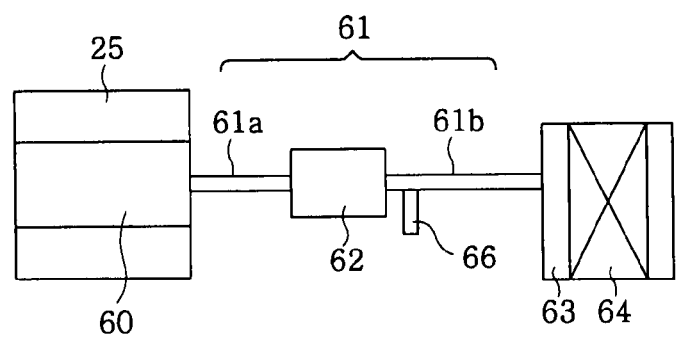
FIGS. 6A and 6B show main elements of substrate processing apparatuses in accordance with the second embodiment and a modification of the second embodiment, respectively, of the present invention.
Figure 6B:
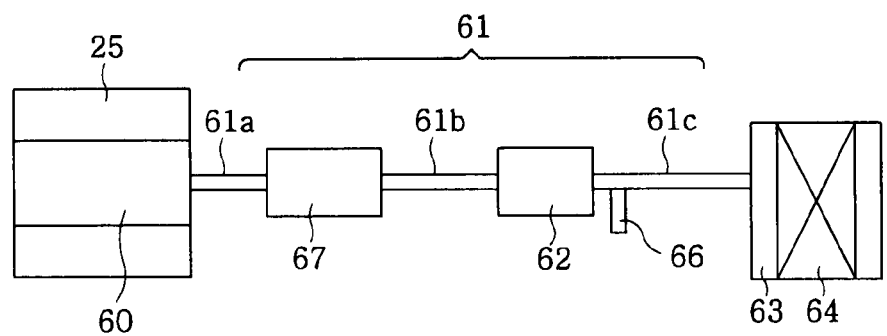
Figure 7:
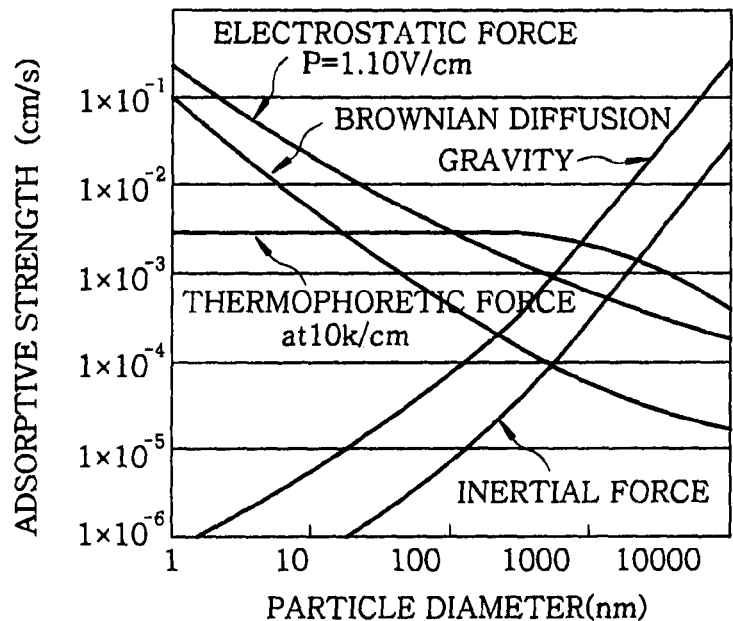
FIG. 7 is a graph showing relationships between a size of a particle and an adsorption strength thereof.
Figure 8:
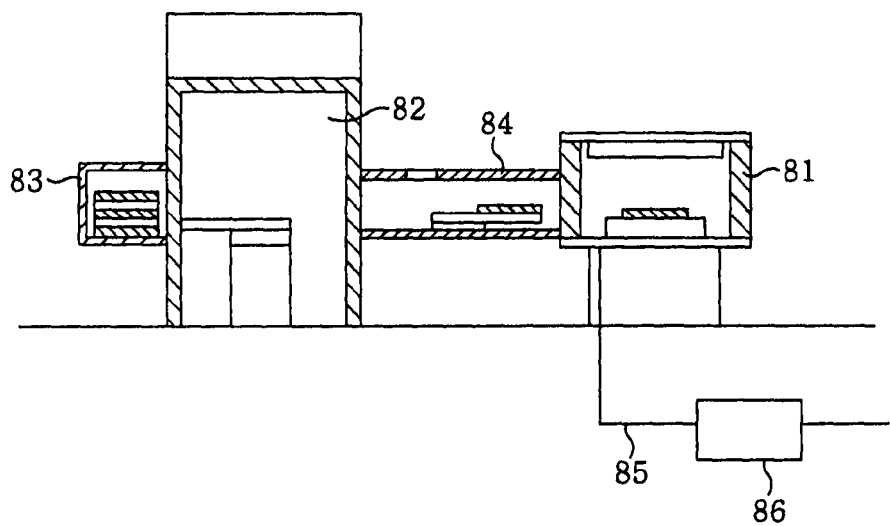
FIG. 8 shows how a prior art substrate processing apparatus is affected by static electricity.

FIGS. 6A and 6B show main elements of a substrate processing apparatus in accordance with the second embodiment and a modification of the second embodiment, respectively, of the present invention. The substrate processing apparatus shown in FIG. 6A is different from the apparatus shown in FIG. 4A, in that a soft X-ray ionizer is provided at downstream of the dry pump, instead of the ionized gas supply pipe 55 that is provided at upstream of the dry pump.

Specifically, the substrate processing apparatus shown in FIG. 6A mainly includes a chamber 60 provided in the process module 25 for performing therein a predetermined etching process on a wafer W serving as a processing target substrate; a gas exhaust path 61 (including gas exhaust paths 61a and 61b) of the chamber 60; a dry pump 62 and a scrubber 63 sequentially provided in a gas flowing direction of the gas exhaust path 61; and a soft X-ray ionizer 66 provided in the gas exhaust path 61b arranged at downstream of the dry pump 62. An activated carbon adsorption layer 64 is provided in the scrubber 63.

When a gas is exhausted from the chamber 60 in such a substrate processing apparatus, the gas is pumped by the dry pump 62 and flows through the gas exhaust path 61 to be exhausted. At this time, as a soft X-ray is irradiated from the soft X-ray ionizer 66 provided at downstream of the dry pump 62 to an exhaust gas, electrons are released from components of the exhaust gas to generate positive ions. Moreover, the same number of negative ions as the positive ions are also generated. As such, the components of the exhaust gas are ionized to generate ionized gas (exhaust gas ionizing process).

Positively charged particles in the exhaust gas are charge-neutralized by being combined with negative ions in the ionized gas, while negatively charged particles are charge-neutralized by being combined with positive ions therein. Accordingly, such charged particles in the exhaust gas are charge-neutralized, thereby suppressing the attachment of the particles on an inner wall surface of the gas exhaust path 61, caused by static electricity.

By the flow of the exhaust gas, such charge-neutralized particles are transferred to the scrubber 63 without being attached onto an inner wall surface of the gas exhaust path 61b. The transferred particles are collected and separated by a filter (not shown) or the like in the scrubber 63. Then, harmful substances of the exhaust gas from which the particles are separated are separated and collected by the activated carbon adsorption layer 64 and, then, the exhaust gas is released to the atmosphere. Alternatively, the particles may be separated from the exhaust gas after the exhaust gas having the charge-neutralized particles is exhausted to an outside.

In accordance with the second embodiment, the soft X-ray ionizer 66 is provided at downstream of the dry pump 62 in the gas exhaust path 61 through which the gas inside the chamber 60 is exhausted. By irradiating the soft X-ray from the soft X-ray ionizer 66 to the exhaust gas flowing through the gas exhaust path 61b, electrons are released from components of the exhaust gas to generate positive ions and the same number of negative ions as that of the positive ions are also generated. Then, positively charged particles in the exhaust gas are neutralized by adsorbing negative ions in the ionized gas, while negatively charged particles are neutralized by adsorbing positive ions therein. Accordingly, the particles are suppressed from being adsorbed onto an inner wall surface of the gas exhaust path 61b.

In the second embodiment, it is preferable to provide the soft X-ray ionizer 66 at immediate downstream of the dry pump 62. This is because, in the gas exhaust path 61, the upstream side (gas exhaust path 61a side) of the dry pump 62 is in a vacuum (depressurized) state; however, the downstream side (gas exhaust path 61b side) thereof is in an atmospheric pressure state; and the particles tend to be easily generated in the exhaust gas of the atmospheric pressure state.

Moreover, a distance in which a charge-neutralization is performed by the ionized gas generated by the soft X-ray ionizer is smaller than, e.g., about 1000 mm. Accordingly, in order to efficiently charge-neutralize the particles in the exhaust gas by securing an effective charge-neutralization distance, it is preferable to generate the ionized gas around an upstream portion of the exhaust gas of the atmospheric pressure state in the downstream side of the dry pump 62 where a particle concentration is thought to be high. The soft X-ray is an X-ray having a relatively long wavelength ranging between, e.g., about 0.1 and 10 mm and a relatively low energy ranging between, e.g., about 0.1 and 2 keV.

Although the soft X-ray ionizer 66 is employed instead thereof as a gas ionizing unit in the second embodiment, an UV beam irradiation ionizer, a local plasma generator, a corona discharge ionizer, or the like may be employed as the gas ionizing unit yielding the same effect as the soft X-ray ionizer 66.

A substrate processing apparatus in accordance with the modification of the second embodiment as shown in FIG. 6B is different from the apparatus shown in FIG. 6A, in that a turbo pump 67 and a dry pump 62 serving as exhaust pumps are sequentially provided in a gas flowing direction of the gas exhaust path 61, and the soft X-ray ionizer 66 is provided at immediate downstream of the dry pump 62. In such a substrate processing apparatus, a gas exhaust path 61c can also be prevented from being blocked by suppressing the particles from being adsorbed onto the inner wall surface of the gas exhaust path 61c.

In the respective embodiments, the substrate to be subjected to the plasma treatment is not limited to a wafer for semiconductor devices. For example, the substrate may be one of various kinds of substrates, which can be used in a flat panel display (FPD) or the like including a liquid crystal display (LCD), a photomask, a CD substrate, a print substrate or the like.

The purpose of the present invention can be achieved by providing a system or an apparatus with a storage medium or the like storing program codes of software realizing the functions of the respective embodiments and allowing a computer (or a central processing unit (CPU) or a microprocessor unit (MPU)) thereof to read and execute the program codes accumulated in the medium.

In this case, the program codes themselves read from the medium realize the functions of the aforementioned embodiments and the present invention includes the program codes and the medium storing the program codes.

The medium for providing the program codes may be, e.g., a floppy (registered trademark) disk; a hard disk; an optical disk, e.g., a magneto-optical disk, CD-ROM, CD-R, CD-RW, DVD-ROM, DVD-RAM, DVD-RW, DVD+RW or the like; a magnetic tape; a nonvolatile memory card; ROM; or the like. The program codes may also be downloaded through networks.

The functions of the aforementioned embodiments can be realized by executing the program codes read by the computer. Alternatively, an operating system (OS) or the like operating on the computer can execute a part or the whole of the actual processing in accordance with the instructions of the program codes and the functions of the embodiments can be realized by the processing executed by the OS or the like.

In addition, the program codes can be read from a storage and inputted to a memory in a built-in function extension board or an external function extension unit of a computer and the functions of the embodiments can be realized by the processing of a CPU or the like in the extension board or the extension unit, which executes the extension function thereof in accordance with the instructions of the program codes to perform a part or the whole of the actual processing.

While the invention has been shown and described with respect to the embodiments, it will be understood by those skilled in the art that various changes and modifications may be made without departing from the scope of the invention as defined in the following claims.

What is claimed is:

1. A substrate processing apparatus comprising:
a processing chamber for accommodating therein a processing target substrate;
a first gas exhaust path connected to the processing chamber through which a gas inside the processing chamber is exhausted;
an exhaust pump provided downstream of the first gas exhaust path;
a second gas exhaust path connected to the exhaust pump;
a scrubber provided downstream of the second gas exhaust path for collecting harmful components from the exhaust gas in the second gas exhaust path; and
an ionized gas providing unit configured to provide an ionized gas to the first or the second gas exhaust path or to the exhaust pump to thereby neutralize charged particles included in the exhaust gas flowing therethrough.

2. The apparatus of claim 1, wherein the ionized gas providing unit is provided in the first gas exhaust path at immediately upstream of the exhaust pump.

3. The apparatus of claim 2, wherein the ionized gas providing unit is an ionized gas supply pipe connected to the first gas exhaust path to provide the ionized gas.

4. The apparatus of claim 1, wherein the ionized gas is a gas containing positive and negative ions.

5. The apparatus of claim 1, wherein the ionized gas providing unit is provided to the second gas exhaust path at immediately downstream of the exhaust pump.

6. The apparatus of claim 5, wherein the ionized gas unit is a gas ionizing unit.

7. The apparatus of claim 6, wherein the gas ionizing unit includes one or more of a soft X-ray ionizer, a corona discharge ionizer, a local plasma generator, and a UV beam irradiation ionizer.

8. A method for exhausting a gas inside a processing chamber of a substrate processing apparatus by neutralizing charged particles included in the exhaust gas, in which the apparatus includes the processing chamber for accommodating therein a processing target substrate; a first gas exhaust path connected to the processing chamber through which the gas inside the processing chamber is exhausted; an exhaust pump provided at downstream of the first gas exhaust path; a second gas exhaust path connected to the exhaust pump; a scrubber provided at downstream of the second gas exhaust path for collecting harmful components from the exhaust gas in the second gas exhaust path; and an ionized gas providing unit for providing an ionized gas to the first or the second gas exhaust path or to the exhaust pump to thereby neutralize the charged particles included in the exhaust gas flowing therethrough, the method comprising:
providing the ionized gas to the exhaust gas flowing through the first or the second gas exhaust path or to the exhaust pump by the ionized gas providing unit to charge-neutralize the charged particles included in the exhaust gas.

9. The method of claim 8, wherein the ionized gas is provided in the first gas exhaust path at immediately upstream of the exhaust pump or in the second gas exhaust path at immediately downstream of the exhaust pump.

10. The method of claim 8, wherein the ionized gas is a gas containing positive and negative ions.

11. The method of claim 8, wherein the ionized gas providing unit is a gas ionizing unit and said providing the ionized gas includes ionizing the exhausted gas in the second gas exhaust path.

12. The method of claim 11, wherein the gas ionizing unit includes one or more of a soft X-ray ionizer, a corona discharge ionizer, a local plasma generator, and an UV beam irradiation ionizer.

* * * * *